United States Patent [19]

Malcolm et al.

[11] 4,161,662
[45] Jul. 17, 1979

[54] STANDARDIZED DIGITAL LOGIC CHIP

[75] Inventors: Robert B. Malcolm, Scottsdale, Ariz.; Clarence E. McDaniel, Wichita Falls, Tex.

[73] Assignee: Motorola, Inc., Schaumburg, Ill.

[21] Appl. No.: 849,047

[22] Filed: Nov. 7, 1977

Related U.S. Application Data

[63] Continuation-in-part of Ser. No. 651,494, Jan. 22, 1976, abandoned.

[51] Int. Cl.² ............................................. H01L 27/04
[52] U.S. Cl. ................................... 307/213; 307/207; 357/40; 357/41; 357/45; 357/42
[58] Field of Search ........................ 357/41, 42, 40, 45, 357/68; 307/303, 304, 207, 213

[56] References Cited
U.S. PATENT DOCUMENTS

| | | | |
|---|---|---|---|
| 3,312,871 | 4/1967 | Seki et al. | 357/45 |
| 3,365,707 | 1/1968 | Mayhew | 357/41 |
| 3,638,202 | 1/1972 | Schroeder | 357/45 |

OTHER PUBLICATIONS

Hibberd, *Integrated Circuits*, McGraw-Hill, 1969, pp. 133-140.

*Primary Examiner*—William D. Larkins
*Attorney, Agent, or Firm*—M. David Shapiro; Eugene A. Parsons

[57] ABSTRACT

A standardized large scale integrated (LSI) array of standard logic cells on a single complementary metal oxide semiconductor (CMOS) chip. The pattern chosen for the layout of the standard logic cells provides very high cell density and, in combination with the "roadways" provided for power and data interconnects and the availability of "cross unders" within any cell chosen, very high utility ratios of the available cells. The standardized logic chip may be used to implement a large variety of logic circuit designs by the simple expedient of a single custom mask design for the metallization pattern for each unique use.

3 Claims, 5 Drawing Figures

STANDARDIZED DIGITAL LOGIC CHIP

This is a continuation-in-part of application Ser. No. 651,494 filed on Jan. 22, 1976, now abandoned.

FIELD OF THE INVENTION

This invention relates to a general logic array CMOS chip employing a plurality of standard logic cells in a unique configuration allowing a very high utilization ratio of the standard cells on the chip.

BACKGROUND OF THE INVENTION

LSI construction of complex digital logic circuit design provides a compact solution to circuit problems via the very high packing density available in this art. This is in large part attributable to the very high percentage of the total volume consumed in the interconnecting wiring and connecting plugs required in older more conventional designs utilizing external wiring between standard element chip packages.

However, the decision to use LSI custom chips commits the designer to a large initial investment in terms of tooling costs. Further, unless the production volume is to be very large, the amortization of the tooling costs may cause the cost of each circuit produced to exceed reasonable economical limits. These problems have given rise to chip designs of the "universal use" type. That is, chips which have standard cell active elements deployed thereon, but with the interconnections in the form of custom metallization patterns left for design by the user. These chips have generally been designed so that various individual components are "wired" through use of a custom metallization layer to form gates, amplifiers, flip-flops, etc. or a chip may consist entirely of standard gate flip-flop or other cells; to be interconnected by a custom metallization pattern. While these circuit chips go part way in solution of the problems set out above, they still leave the designer to face some serious shortcomings. Packing density in these "universal" units do not approach that available by use of custom design of the entire chip for a specific circuit. An excessive amount of chip space is restricted to the interconnect metallization and in the case of a chip utilizing standard cells of only one circuit type, it is necessary to provide off chip interconnections to standard cells of another type. This further restricts the designer because the off chip connections are limited by the limited number of pin connections to the outside because of the very small chip sizes. The designer, having successfully overcome these hurdles then finds that when be accomplishes conversion of these universal designs to custom designs for high volume production, very little of what he has done is usable and the correlation between designs is very low. There is a very large reduction in total size and external wiring complexity leading to questionable usefulness of the initial design work.

Studies of some prior art logic circuits which are of a modular type readily available to the industry show that these circuits may be economically implemented as a part of a larger standardized logic chip if the ratio of gates to flip-flops lies in the range from 2.0–2.5 to 1. The circuits which are identified in Table I, below, are of this type and fit within the range of gate to flip-flop ratios when those amplifiers included therein for the purpose of isolating sinks and sources are deleted. This can be legitimately done for the purposes of gate to flip-flop ratio analysis since when these standard circuits are combined on a single chip, there is no need for the buffering functions as there is when sources and loads must be assumed to be located off chip.

TABLE I

| Part No. | Circuit Type | Manufacturer | Publication Reference | Pages |
| --- | --- | --- | --- | --- |
| DM 54/ DM 74165, L 165A | Shift Register | National Semiconductor Corp. | TTL Data Book, 2-76 | 2-79 thru 2-81 |
| MC 14015 | Shift Register | Motorola, Inc. | Semiconductor Data Library, Vol. 5, McMos Integrated Circuits, 1975 | 7-45 thru 7-50 |
| MC 14017 | Decade Counter/ Divider | Motorola, Inc. | Same as above | 7-57 thru 7-62 |
| MC14518*, MC14520* | Decade Counter | Motorola, Inc. | Same as above | 7-200 thru 7-204 |
| CD4018AD CD4018AE CD4018AF CD4018AK | Decade Counter/ Divider | RCA | RCA COS/MOS Integrated Circuits Book (SSD-203c), 1975 | 99 |
| CD4022AD CD4022AE CD4022AF CD4022AK | Divide by 8 Counter/ Divider | RCA | Same as above | 119 |

*This part includes 3-input gates. In a standard chip implementation where only 2-input gates are available, it would be necessary to redesign the gate logic in 2-input gate configuration.

While implementation of the above circuits on a single large scale integrated circuit chip would rapidly lead to limitations imposed by a shortage of input/output bonding pads if all inputs and outputs of these circuits were necessarily connected to off-chip circuits, in most cases these and similar custom circuits may be interconnected on the large scale chip avoiding this problem.

The circuits of Table I are meant to be illustrative of circuits having a gate to flip-flop count ratio of from 2.0 to 2.5 and certainly the custom circuits which might have that ratio are not limited to those of or similar to the circuits of Table I. We have implemented two custom circuits having 67 gates and 29 flip-flops and 62 gates and 27 flip-flops, respectively, (ratio of approximately 2.3 to 1 in each case) on the chip of the invention.

SUMMARY OF THE INVENTION

The foregoing and other shortcomings and problems of the prior art are overcome, in accordance with the present invention, by utilizing a configuration of two types of standard logic cells on a single CMOS chip and by providing "roadways" on the chip for both metallized power source conductors to the standard cells, interconnections within each standard cell and for data interconnections between the standard cells.

According to one aspect of the invention, subsurface cross-under paths are provided to avoid electrical conduction between crossing conductors of either the power or data lines.

According to another aspect of the invention, the number of one standard cell type as related to a second standard cell type is controlled to provide an optimum ratio for maximum utilization of both standard cells on the chip.

According to still another aspect of the invention, the standard cells of each type are arranged in straight row configuration to implement power source connections.

According to yet another aspect of the invention, each of the standard cells has a plurality of common connections, each of these common connections being available along both opposite edges of the cell adjacent the roadways. This allows the use of the input data or clock connections to transfer signals from one adjacent roadway to the next whether power is applied to the cell or not. it allows the output of the cell to be available at either adjacent roadway when the cell is powered and input signals are applied, and, subject to some design limitations, it allows the cell's output terminals to be used to transfer signals from one adjacent roadway to the other when the cell is not powered.

The foregoing and other aspects of the present invention will be understood more fully from the following detailed description of an illustrative embodiment of the present invention in conjunction with the accompanying drawings, in which:

FIG. 1 shows a layout configuration of gate and flip-flop standard cells on a CMOS chip, illustrative of the preferred embodiment of the invention.

FIG. 2 is a surface view of the input and output circuits of a typical 2-input NAND gate standard logic cell. The rest of the cell detail is omitted for clarity. Dotted lines denote semiconductor channels and solid lines denote a portion of a standard surface metallization pattern.

FIG. 3 is a surface view of the data input, data output (Q) and clock circuits of a typical D-Flip-Flop standard logic cell. The remainder of the cell detail is omitted for clarity. Dotted lines denote semiconductor channels and solid lines denote a portion of a standard surface metallization pattern.

DETAILED DESCRIPTION OF THE INVENTION

Figure 1:
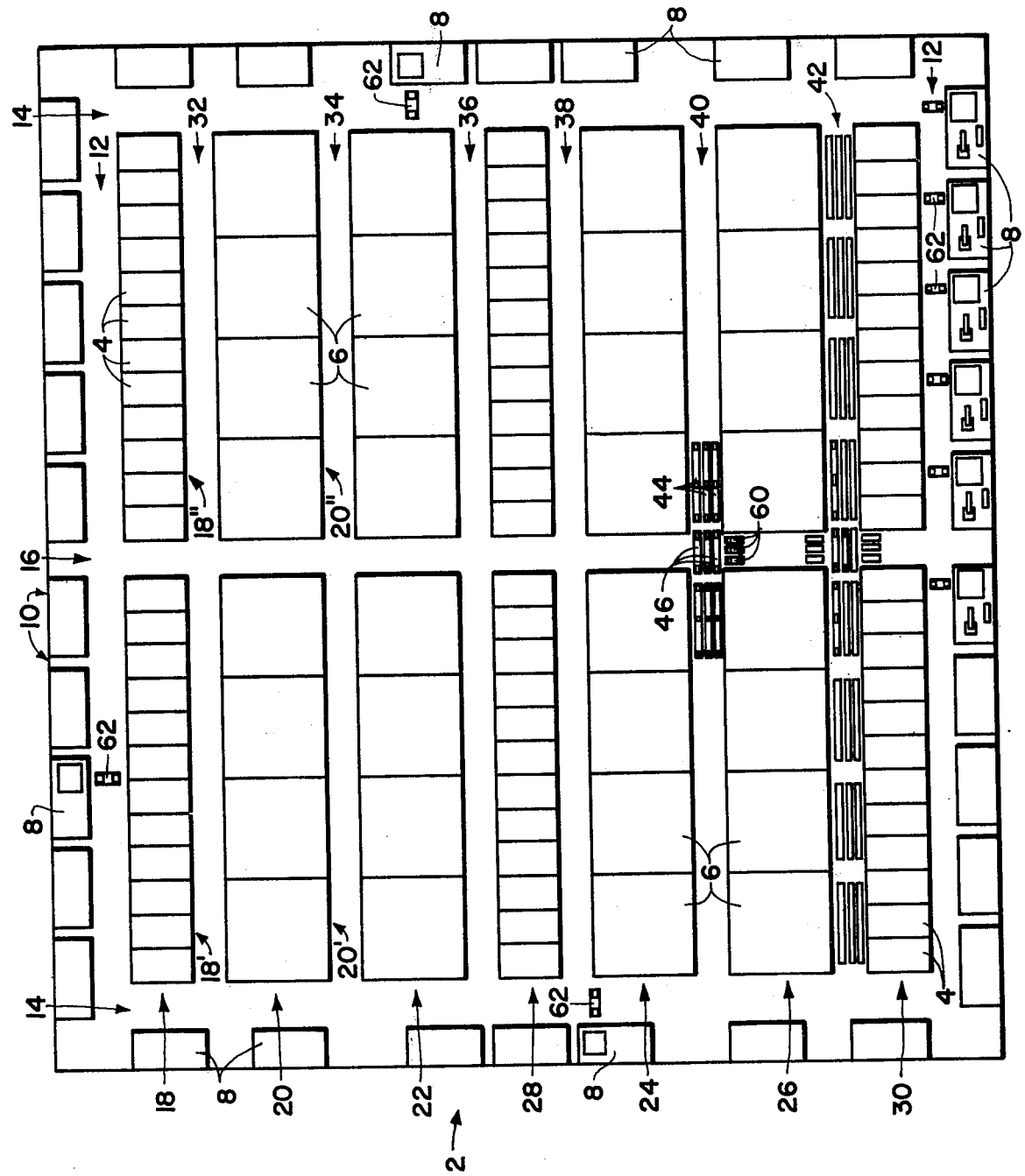

FIG. 1 is a surface view of semiconductor chip 2 of the invention. An array of two types of standard cell integrated digital circuits are there disposed. One of the standard cells is a two input NAND gate 4, shown in more detail in FIG. 2. The other of the standard cells is a "D" type flip-flop 6 as shown in more detail in FIG. 3.

It will be understood that the logic cells arranged in rows 18, 20, 22, 24, 26, 28 and 30 of FIG. 1 require a metallization layer to complete the interconnections within each cell. The metallization layer contained within each logic cell is a standard metallization pattern which varies only depending upon whether the cell row is made up of NAND gates (rows 18, 28 and 30) or flip-flop gates (rows 20, 22, 24 and 26). The term "logic cell" is used herein to describe either the unmetallized or standard metallized cell with full knowledge that any given cell will not operate as a logic element until the standard metallization pattern is applied. The actual deposition pattern within the chip substrate and the actual metallization pattern within the confines of each logic cell pattern are of no real consequence to the invention with one exception, discussed infra), since it will be readily recognized that one of ordinary skill in the CMOS art may provide any number of satisfactory logic cell designs. The above mentioned exception is based on the fact that the deposition patterns and standard metallization patterns within each logic cell area of this embodiment of the invention provide a plurality of electrical connections between opposite edges of each cell which are adjacent roadways such as 32 and 34 on chip 2 of FIG. 1. These interconnections also may serve as inputs and or outputs from the particular logic cell as will be further explained, below.

It will also be clearly understood that there is one and only one metallization pattern required by the illustrated embodiment of the invention. This is not intended to limit the practice of the invention to embodiments restricted by the number of metallic layers, however. Such limitations are, of course, only a function of the claims which follow.

In the illustrated best embodiment of the invention the single metallization layer comprises two portions:

(1) That portion referred to above as the standard pattern used to interconnect the various semiconductor diffusions within each logic cell to create a working logic element, and (2) An additional custom pattern portion which is provided to power the logic cells, interconnect them mutually and to bonding pads 8 of chip 2 to create a working logic system or subsystem.

There are seven rows of standard cells in the preferred embodiment of FIG. 1. There are ten bonding pads 8 on each of two opposing edges of chip 2 and seven bonding pads 8 on each of the other two opposing edges. Each bonding pad 8 is arranged so that by predetermining one of two metallization pattern options, either an input or an output termination may be realized therefrom. For the remainder of this description, edge 10 of semiconductor chip 2 will be referred to as the "reference edge" of chip 2.

Adjacent and parallel to bonding pads 8 are four "roadways" 12, 14. Roadways 12, parallel to reference edge 10, each provide space for four parallel metallized current leads (not shown), and roadways 14, perpendicular to reference edge 10, each provide enough space for five parallel metallized current leads (not shown). As will be seen, the pattern of metallized leads in roadways 12, 14 are optional and are stipulated by the end user of the invention.

Beginning at roadway 12 nearest to and parallel with reference edge 10, seven parallel rows of standard logic cells are disposed. Each of these standard logic cell rows are parallel to reference edge 10. Roadway 16, perpendicular to reference edge 10, divides each of the standard cell rows into two equal half segments.

Standard cell row 18 made up of segment 18' and segment 18" contains twenty-four NAND gate standard cells 4, twelve in each segment. The inputs and outputs of NAND gate 4 and the electrical connections therebetween are shown typically in more detail in FIG. 2.

Standard cell row 20 made up of segment 20' and segment 20", contains eight "D" flip-flop standard cells 6, four in each of two segments 20', 20". The connections to D flip-flop 6 and the interconnections therebetween are shown typically in more detail in FIG. 3.

Figure 3:
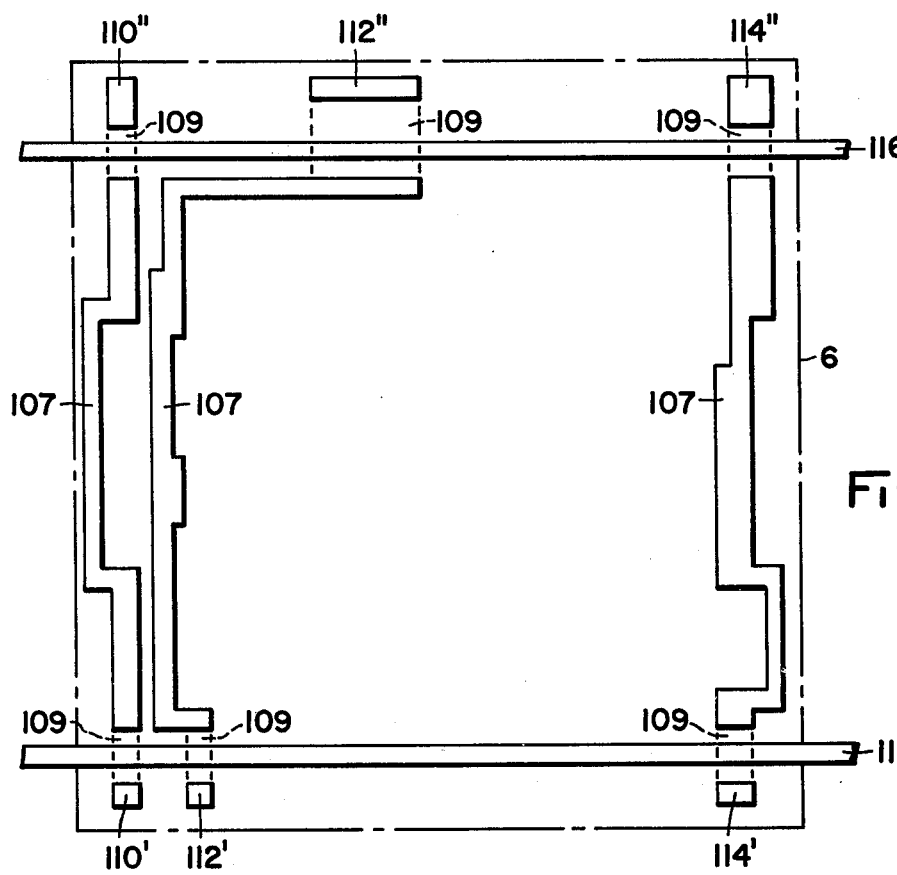

Standard cell rows 22, 24, 26 are each made up of two segments each as is row 20. Each segment comprises four "D" flip-flop standard cells 6 as shown in FIG. 3.

Standard NAND gates logic cell rows 28, 30 are made up of two segments each as is row 18. Each segment comprises twelve NAND gate standard cells 4.

In other words, beginning nearest reference edge 10 and parallel to it, there are seven rows of standard cells which, in order of increasing distance from reference edge 10, comprise standard cells of the following types:

A. 24 NAND gate cells 4, Row 18.
B. 8 "D" flip-flop cells 6, Row 20.
C. 8 "D" flip-flop cells 6, Row 22.
D. 24 NAND gate cells 4, Row 28.
E. 8 "D" flip-flop cells 6, Row 24.
F. 8 "D" flip-flop cells 6, Row 26.
G. 24 NAND gate cells 4, Row 30.

Each of rows 18, 20, 22, 24, 26, 28, 30 above, is made up of two equal segments as shown in FIG. 1. Each segment has one half of the total number of standard cells listed above. For example, row 18, A. above, has twelve NAND gate standard cells in each of two equal segments 18', 18".

Figure 4:
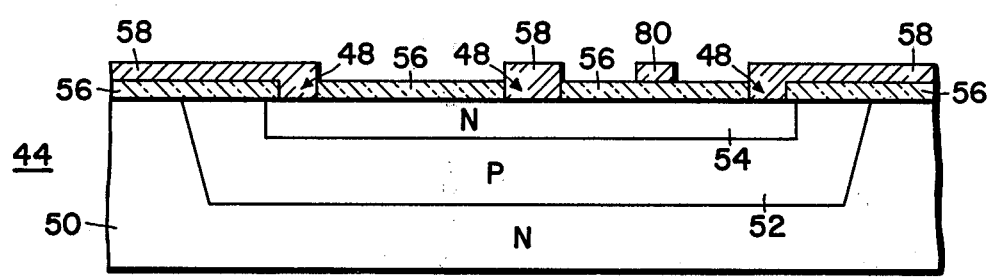
FIG. 4 is a cross-sectional view through a typical tunnel conductor or cross-under in the roadways of FIG. 1.

Interposed between each adjacent pair of the rows A-G, above, is a roadway; a total of six such roadways 32, 34, 36, 38, 40, 42 being disposed therebetween, such roadways being parallel to reference edge 10, roadways 12 and being parallel to rows 18, 20, 22, 24, 26, 28, 30. Each of the six roadways 32, 34, 36, 38, 40, 42, is wide enough to contain eight parallel electrical conductor pathway means. Disposed in each of three of the eight electrical conductor pathways are an array of cross-unders 44 (see, also, FIG. 5). Each group of three cross-unders 44 is positioned adjacent a "D" flip-flop 6 standard cell, that is, each cross-under 44 extends no more than the width of a D flip-flop standard cell 6 along the roadway in which it lies. FIG. 4 shows a cross-section of a typical cross-under 44. In addition to cross-unders 44 located adjacent to "D" flip-flops 6, FIGS. 1 and 5, there are intersection cross-unders 46 located in the intersections, for example, of roadways 16 and 40 (not shown in FIG. 5). Cross-unders 46 are similar to cross-under 44 shown in FIG. 4 except that cross-under 44 of FIG. 4 has three connection pads 48 while intersection cross-unders 46 have but two connection pads 48 and the cross-unders are shorter in length. Cross-unders 44 of FIG. 4 are about 18 mils in length and intersection cross-unders 46 are shorter.

Capacitance of cross-unders 44 is relatively high; depending on whether it is of N or P substrate; it is approximately 2.5 picofarad or 1 picofarad respectively, for three connection 48 configuration 44 of FIG. 4. The resistance for the 18 mil length cross-unders 44 of FIG. 4 is about 400 ohms for the full length, or about 200 ohms from the center connection 48 to either end connection 48. As before stated, substrate 50 may be of P or N material. FIG. 4 illustrates an N material substrate 50 and, as is well known in the art, a guard region 52 of P doped material. The cross-under conductor 54 is an N region. Alternatively, if a P material were used as a substrate, guard region 52 may be dispensed with. In either case the cross-under conductor is an N region diffusion either in a P guard region or in a P substrate. Three connection pads 48 are shown, one at each end of cross-under conductor 54 and one in the center. Except for those areas configured for pads 48, the diffused substrate is protected and insulated by insulating layer 56 which may be silicon dioxide. This enables metallic conductors 58 and 80 to be deposited on the chip as shown without any connection to diffused channel 54 except at pads 48. Cross-unders 46, 60 and 62 (see FIG. 1) have only two connection pads, and, although not illustrated, the rest of their structure is similar to cross-under 44 of FIG. 4 or its alternative P material substrate, described, supra.

Roadway 16, FIG. 1, runs perpendicular to reference edge 10 of semiconductor chip 2 and through the center of chip 2. It has space for five conductive pathways and each of three of these pathways has disposed therein a plurality of cross-unders 60. As before stated, cross-unders 60 have two connection pads 48. Cross-unders 60 lie in parallel groups of three, called a cluster, in roadway 16. A first cluster of cross-unders 60 (not shown) lies in roadway 16 adjacent roadway 12. A second cluster of cross-unders 60 (not shown) lies in roadway 16 adjacent roadway 32 on the side of roadway 32 furthest from reference edge 10 of chip 2. A third and fourth cluster of cross-unders 60 (not shown) lie in roadway 16 adjacent each side of roadway 34. A fifth and sixth cluster of cross-unders 60 (not shown) lie in roadway 16 adjacent each side of roadway 36. A seventh cluster of cross-unders 60 (not shown) lie in roadway 16 adjacent roadway 38 on the side furthest from reference edge 10 of chip 2. An eighth and ninth cluster of cross-unders 60 lie in roadway 16 adjacent each side of roadway 40. (Only one of these clusters is shown). A tenth and eleventh cluster of cross-unders 60 lie in roadway 16 adjacent either side of roadway 42. Cross-unders 60 lie parallel to roadway 16, cross-unders 46 lie perpendicular to roadway 16. Many of the clusters are omitted from FIG. 1 for clarity.

Cross-unders 62 are also similar to cross-unders 44, FIG. 4. But, they too, differ, in that they each have but two connection pads 48, each located at an end of cross-under conductor 54. Cross-unders 62 are located in and perpendicular to roadways 12, 14. Each cross-under 62 is adjacent a bonding pad 8. This concludes the description of the layout of semiconductor chip 2, FIG. 1.

Following is a description of the purposes of the various portions of semiconductor chip 2 layout.

Bonding pads 8 are used for connection of signal inputs and outputs and power sources to chip 2 from and to the off-chip domain. Roadways 12, 14, 16, 32, 34, 36, 38, 40 and 42 are used for interconnecting bonding pads 8, standard cells 4 and standard cells 6 in a useful digital logic configuration and for routing power to standard cells 4 and 6. It will be understood that chip 2, as described, supra, has none of the necessary inter-connections made and that the ultimate user must stipulate to the manufacturer the desired connections or system logic functions to be accomplished. Standardized digital logic chip 2, as described, supra, then is metallized with a single pattern which provides all of the necessary interconnections of both the custom and the standard type metallization to provide, in turn, the user's desired logic functions. The unique chip pattern described allows a very high "use factor" of standard cells 4, 6 in most custom circuit applications. The inclusion of strategically located cross-unders 44, 46, 60 and 62 and the unique locations of bonding pads 8, roadways 12, 14, 16, 32, 34, 36, 38, 40 and 42 and their geographic relationship to the position of standard cells 4 and 6, all contribute to an extremely high "use factor". "Use factor" as used herein refers to the ratio of used standard cells 4, 6 to unused standard cells 4, 6 in chip 2 as subsequently interconnected by the user.

Figure 2:
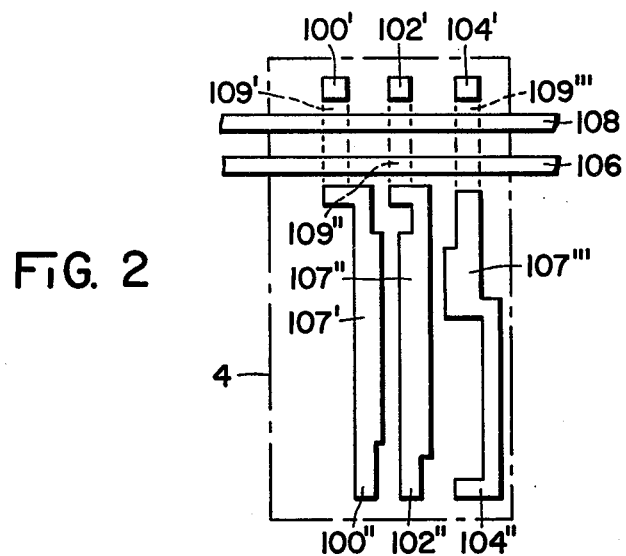

A further feature of chip 2 which contributes to a high use factor will be best understood by referring to FIGS. 2 and 3. FIG. 2 illustrates a portion of the layout detail of a typical NAND gate 4 standard cell. NAND gate 4 has two logic inputs 100, 102 and one logic output 104. However, logic input 100 is available on each of two connecting tabs 100', 100" and logic input 102 is also available on each of two connecting tabs 102', 102". Logic output 104 is also available on each of two connecting tabs 104', 104". In other words, input terminals connecting tabs 100', 100" are electrically common, connected internally by metallization pattern 107' and channel 109'; input terminal connecting tabs 102', 102" are electrically common, connected internally by metallization pattern 107" and channel 109"; and output terminal connecting pads 104', 104" are electrically common, connected internally by metallization pattern 107''' and channel 109'''. Metallization pattern 107', 107" and 107''' are deposited together with all of the rest of chip 2 metallization pattern, but that portion of the total pattern as typified by pattern 107', 107" and 107''' may be considered as a portion of the standard portion of the pattern while certain other portions of the metallization pattern are a custom portion of the pattern as beforementioned.

The dotted line portions of the interconnecting conductors from like input and output terminals of NAND gate 4 are channels 109', 109" and 109''' which provide a semiconductor cross-under beneath power lines 106 and 108, also a part of single metallization pattern 107. Tabs 100' and 100" are located at the opposite ends of NAND gate 4, as are tabs 102', 102" and tabs 104', 104". Since the edges of NAND gate 4 standard cell on which the input and output terminal tabs are located are positioned adjacent to roadways, for example, 36, 38 of FIG. 1, it will be clearly seen that NAND gate 4 input and output logic terminals are readily accessible from either adjacent roadway 36 or 38 thus allowing an extremely flexible arrangement for making interconnections between any NAND gate 4 standard cell and any other logic standard cell 4, 6 or bonding pad 8 on chip 2.

FIG. 3 illustrates "D" flip-flop 6 standard logic cell. In a manner similar to that shown in FIG. 2, for NAND gate 4 standard logic cell, "D" flip-flop 6 also utilizes dual terminal tabs on opposite edges of standard cell 6. Data input tabs 110', 110" are interconnected, similar to like interconnections of FIG. 2, as are clock tabs 112', 112" and Q output tabs 114', 114". It may be seen then, that tabs 110', 110"; tabs 112', 112"; and tabs 114', 114", of "D" flip-flop 6 may be used in a manner similar to tabs 100', 100"; tabs 102', 102"; and tabs 104', 104" of NAND gate 4 (FIG. 2), as means for accomplishing interconnections between the adjacent roadways and standard cells of FIG. 1.

Figure 5:
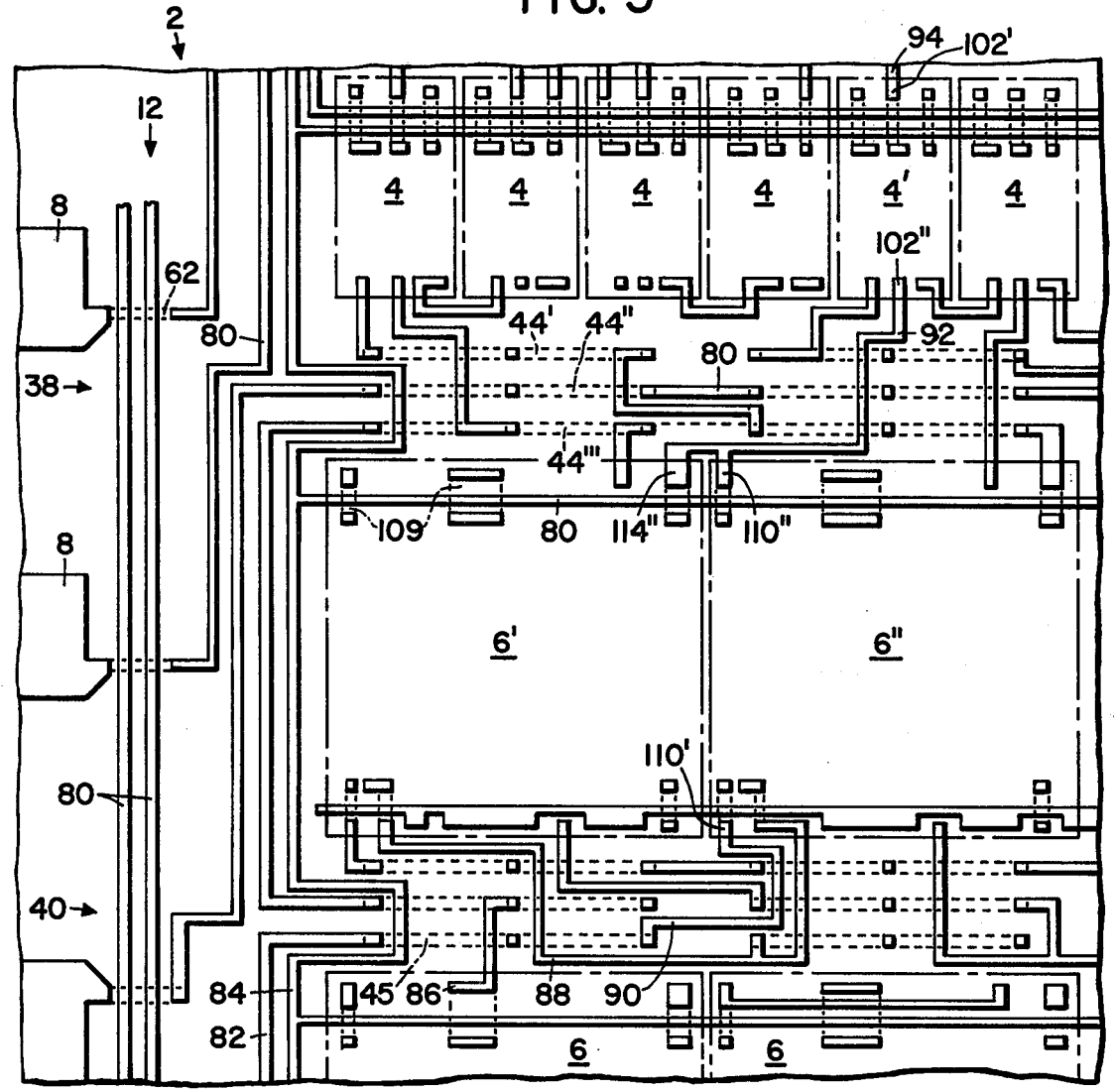
FIG. 5 illustrates an example of a typical interconnection of a portion of the semiconductor chip of FIG. 1.

FIG. 5 illustrates an example of a portion of a custom circuit as implemented by a custom metallization layer 80 on chip 2 of FIG. 1. Six standard gate logic cells 4 are shown in outline. Two full and two partial standard flip-flop logic cells 6 are also shown in outline. Portions of roadways 12, 38 and 40 are shown by way of example. Circuit conductors 80 are shown as solid lines while underpass portions 44, 62 and 109, having the structure described above for semiconductor channel 54 in FIG. 4 are shown as dotted lines. Since the circuit shown is only a portion of a very unique circuit used in a highly custom application, it will not be described in any great detail but a few of the features of the circuit are described below to illustrate the utility of the chip of the invention as a result of the flexibility afforded thereby. It will be noted that conductor 82, part of custom conductor pattern 80, enters the area of the chip covered by FIG. 5 at the lower left. It is connected to underpass 45 which provides a conduction path under metallized conductors 84, 86 and 88. The conductive path surfaces by means of a connection to conductor 90 which connects to data input tab 110' of flip-flop cell 6". The conductive path is then connected (connection not shown) within flip-flop cell 6" to data tab 110" as has been already described. The conductive path then proceeds via conductor 92 to the "Q" output tab of flip-flop standard cell 6' and to data input tab 102" of gate standard cell 4'. Again, as has been described above, the conductive path proceeds internally (not shown) through gate cell 4' to data input tab 102' and thence out of the area shown by FIG. 5 by way of conductor 94. Cross-unders 44 and the feed-through capability of cells 4 and 6 play important roles in the ability of chip 2 to allow the conductive paths which have been described. Further inspection of FIG. 5 by the reader will reveal equally important roles played by placement and usage of cross-unders 62, bonding pads 8 and the general layout of chip 2.

Another inventive aspect of the layouts of NAND gate 4 and "D" flip-flops 6 of FIG. 1 is the manner in which power leads 106, 108, 116, 118 are routed (not shown in FIG. 1 in the interest of clarity). Two power leads are required for the operation of each standard cell 4, 6.

NAND gate 4 standard cell (FIG. 2) provides adjacent paths 106, 108 for metallization to supply power to each NAND gate 4. Since NAND gates 4 always occur in a row of two segments, twelve NAND gates 4 to a segment, the metallization pattern for power supply connections are merely two straight parallel metallization ribbons layed in paths 106, 108, FIG. 2. Where these metallization ribbons cross roadway 16 (FIG. 1), cross-unders 60 avoid any electrical contact with other leads which may be located in and parallel to roadway 16. The power supply metallization ribbons may not always be of the same pattern. They may be fed from any of the roadways on chip 2 or any combination thereof and they may be supplied from any two or more of bonding pads 8. Where it is determined to be advantageous, power metallization ribbons to any contiguous standard cells located on either end (or therebetween) of any segment may be omitted and, thus, these cells will not be powered. This may be a useful design device where more feed-through interconnects are needed than can be supplied by roadway paths or input terminals of standard cells 4, 6. In this way, output terminal tabs 104 of gate cells 4 (and 114 of "D" flip-flop 6) may also be used for feed-through purposes as will be apparent to one skilled in the logic design art.

FIG. 3 shows that "D" flip-flop 6 standard logic cell also has two paths 116, 118 for deposition of continuous parallel metallization ribbons for power supply purposes. They differ from paths 106, 108 of NAND gate 4, FIG. 2, only in that they are not adjacent, although it will be clear to one skilled in the art that this is only a limitation imposed in this particular embodiment of the invention and that in alternative embodiments, a number of other patterns might be utilized. Except for this difference, which requires the placement of cross-unders 60 to be as previously described in roadway 16 (FIG. 1), the concept is the same as that described for pathways 106, 108 in NAND gate 4 standard cell, FIG. 2.

In summary, it will be seen that the use of standard cells with built-in cross-unders to provide for metallized power lead pathways, the dual tab system of standard cells 4 and 6 the ratio between and relative positioning of NAND gate 4 standard cells and "D" flip-flop 6 standard cells, the positioning of roadways 12, 14, 16, 32, 34, 36, 38, 40 and 42, the use and placement of cross-unders 44, 46, 60 and 62 and the dual input-output use of bonding pads 8, all in combination, provide an extremely flexible interconnect system. It is only necessary to manipulate final metal conductor disposition on semiconductor chip 2 to provide a nearly infinite set of logic functions from standard semiconductor chip 2. This flexibility provides, thereby, a very high use factor for standard cells 4, 6. This means that the designer, utilizing the chip of the invention, may accomplish extremely compact and complex logic functions by the relatively low cost expedient of providing only a single metallization mask for use with standard chip 2. Since basic chip 2 may therefore be utilized in multiple applications, the amortized tooling cost and production lead time may be considerably reduced in each application. Furthermore, because chip 2 provides a relatively high density of logic elements, any custom chip formed thereon may readily be converted to a standard production chip with good economy.

Various modifications and changes may be made to the present invention from the principles of the invention described above without departing from the spirit and scope thereof, as encompassed in the accompanying claims.

What is claimed is:

1. A semiconductor chip including a plurality of logic cell means and a plurality of bonding pad means, comprising in combination:
   a plurality of first roadway means for providing space for placeable electrical conductors between at least two of the plurality of logic cell means, each of said plurality of first roadway means having a longer and a shorter dimension;
   a plurality of second roadway means for providing space for placeable electrical conductors between at least one of the plurality of logic cell means and at least one of the plurality of bonding pad means, said second roadway means having a longer and a shorter dimension;
   first cross-under means for bypassing said placeable electrical conductors, said first cross-under means being disposed adjacent to each of the plurality of logic cell means in said first roadway means, said first cross-under means having a longer dimension and a shorter dimension, said longer dimension of said first cross-under means being parallel to said longer dimension of said first roadway means;
   second cross-under means for bypassing said placeable electrical conductors, said second cross-under means being disposed adjacent each of the plurality of bonding pad means in said second roadway means, said second cross-under means having a longer dimension and a shorter dimension, said longer dimension of said second cross-under means being perpendicular to said longer dimension of said second roadway means; and
   wherein the logic cell means further comprises:
      a plurality of logic gates; and
      a plurality of flip-flops, said plurality of logic gates being a multiple of said plurality of logic flip-flops, said multiple being in the range of from 2.0 to 2.5.

2. The semiconductor chip according to claim 1 wherein the logic cell means are arranged in seven parallel rows, each of said parallel rows being separated from the others of said rows by one of said first roadway means, said parallel rows of said logic cell means being disposed on the chip in a predetermined pattern.

3. The semiconductor chip according to claim 2 wherein said seven parallel rows of logic cell means are arranged in a predetermined pattern beginning with a first of said seven parallel rows being nearest one edge of the chip and proceeding to a seventh of said seven parallel rows being nearest an opposite edge of the chip, said first, fourth and seventh of said parallel rows being of said logic gate type and said second, third, fifth and sixth of said parallel rows being of said logic flip-flop type.

* * * * *